United States Patent
Kim et al.

(10) Patent No.: US 11,038,476 B2
(45) Date of Patent: *Jun. 15, 2021

(54) POWER AMPLIFICATION DEVICE, TERMINAL HAVING THE SAME, AND BASE STATION HAVING THE SAME

(71) Applicants: Samsung Electronics Co., Ltd., Suwon-si (KR); POSTECH ACADEMY-INDUSTRY FOUNDATION, Pohang-si (KR)

(72) Inventors: Jihoon Kim, Suwon-si (KR); Bumman Kim, Pohang-si (KR); Kyunghoon Moon, Suwon-si (KR); Seokwon Lee, Daegu (KR); Daechul Jeong, Pohang-si (KR); Byungjoon Park, Pohang-si (KR); Juho Son, Seoul (KR)

(73) Assignees: Samsung Electronics Co., Ltd., Suwon-si (KR); Postech Academy-Industry Foundation, Pohang-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/715,502

(22) Filed: Dec. 16, 2019

(65) Prior Publication Data

US 2020/0119701 A1  Apr. 16, 2020

Related U.S. Application Data

(63) Continuation of application No. 15/862,213, filed on Jan. 4, 2018, now Pat. No. 10,511,271.

(30) Foreign Application Priority Data

Jan. 6, 2017 (KR) .......................... 10-2017-0002409

(51) Int. Cl.
*H03F 3/04* (2006.01)
*H03F 1/56* (2006.01)
(Continued)

(52) U.S. Cl.
CPC ............. *H03F 1/56* (2013.01); *H03F 1/0211* (2013.01); *H03F 1/3205* (2013.01);
(Continued)

(58) Field of Classification Search
CPC .... H03F 1/0211; H03F 1/0216; H03F 1/0222; H03F 1/0233; H03F 3/68; H03F 3/04
(Continued)

(56) References Cited

U.S. PATENT DOCUMENTS 6,701,138 B2 * 3/2004 Epperson .............. H03F 1/0211
  330/133
7,135,918 B1 11/2006 Outaleb et al.
(Continued)

FOREIGN PATENT DOCUMENTS

KR  10-2016-0096288 A  8/2016
KR  10-1681048 B1  12/2016
WO  2006/115879 A2  11/2006

OTHER PUBLICATIONS

Peter Hazucha et al., Area-Efficient Linear Regulator With Ultra-Fast Load Regulation, IEEE Journal of Solid-State Circuits, vol. 40, No. 4, Apr. 1, 2005.
(Continued)

*Primary Examiner* — Steven J Mottola
(74) *Attorney, Agent, or Firm* — Jefferson IP Law, LLP

(57) ABSTRACT

The method and system for converging a 5th-generation (5G) communication system for supporting higher data rates beyond a 4th-generation (4G) system with a technology for internet of things (IoT) are provided. The method includes intelligent services based on the 5G communication tech-
(Continued)

nology and the IoT-related technology, such as smart home, smart building, smart city, smart car, connected car, health care, digital education, smart retail, security and safety services. The system includes a power amplification device capable of minimizing the effect of envelope impedance. The power amplification device may be incorporated in a terminal and a base station.

16 Claims, 10 Drawing Sheets

(51) Int. Cl.
*H03F 1/32* (2006.01)
*H03F 1/02* (2006.01)
*H03F 3/45* (2006.01)
*H03F 3/193* (2006.01)
*H03F 3/21* (2006.01)
*H04W 88/08* (2009.01)

(52) U.S. Cl.
CPC ........... *H03F 1/3211* (2013.01); *H03F 1/565* (2013.01); *H03F 3/193* (2013.01); *H03F 3/211* (2013.01); *H03F 3/45475* (2013.01); *H03F 2200/222* (2013.01); *H03F 2200/267* (2013.01); *H03F 2200/271* (2013.01); *H03F 2200/387* (2013.01); *H03F 2200/408* (2013.01); *H03F 2200/451* (2013.01); *H03F 2200/534* (2013.01); *H03F 2200/537* (2013.01); *H03F 2200/541* (2013.01); *H03F 2203/21103* (2013.01); *H03F 2203/21139* (2013.01); *H04W 88/08* (2013.01)

(58) Field of Classification Search
USPC .................................. 330/133, 134, 295, 297
See application file for complete search history.

(56) References Cited

U.S. PATENT DOCUMENTS

| | | |
|---|---|---|
| 8,344,806 B1 | 1/2013 | Franck et al. |
| 2003/0227330 A1 | 12/2003 | Khanifar et al. |
| 2009/0096531 A1 | 4/2009 | Shimamoto et al. |
| 2009/0278610 A1 | 11/2009 | Murji et al. |
| 2015/0014041 A1 | 1/2015 | Wimpenny |
| 2015/0244325 A1 | 8/2015 | Irvine et al. |
| 2016/0065142 A1* | 3/2016 | Paek ............. H03F 1/0227 330/295 |
| 2016/0094186 A1 | 3/2016 | Cohen |
| 2017/0117856 A1 | 4/2017 | Zhu et al. |

OTHER PUBLICATIONS

Marc Franco et al., Minimization of bias-induced memory effects in UHF radio frequency high power amplifiers with broadband signals, Radio and Wireless Symposium, 2007 IEEE, Jan. 9-11, 2007.
European Search Report dated Aug. 16, 2019, issued in European Application No. 18736317.1-1203 /3529894.
Kim Jooseung et al: "Analysis of Far-Out Spurious Noise and its Reduction in Envelope-Tracking Power Amplifier", IEEE Transactions on Microwave Theory and Technizues, Planum, USA, vol. 63, No. 12 Dated Dec. 1, 2015.

* cited by examiner

POWER AMPLIFICATION DEVICE, TERMINAL HAVING THE SAME, AND BASE STATION HAVING THE SAME

CROSS-REFERENCE TO RELATED APPLICATION(S)

This application is a continuation application of prior application Ser. No. 15/862,213, filed on Jan. 4, 2018, which will issue as U.S. Pat. No. 10,511,271 on Dec. 17, 2019 and was based on and claimed the benefit under 35 U.S.C. § 119(a) of a Korean patent application filed on Jan. 6, 2017 in the Korean Intellectual Property Office and assigned Serial number 10-2017-0002409, the entire disclosure of which is hereby incorporated by reference.

JOINT RESEARCH AGREEMENT

The present disclosure was made by or on behalf of the below listed parties to a joint research agreement. The joint research agreement was in effect on or before the date the present disclosure was made and the present disclosure was made as a result of activities undertaken within the scope of the joint research agreement. The parties to the joint research agreement are 1) SAMSUNG ELECTRONICS CO., LTD. and 2) POSTECH ACADEMY-INDUSTRY FOUNDATION.

TECHNICAL FIELD

The present disclosure relates to a power amplification device, a terminal having the same, and a base station having the same. More particularly, the present disclosure relates to a power amplification device capable of minimizing the effect of envelope impedance.

BACKGROUND

To meet the demand for wireless data traffic having increased since deployment of fourth generation (4G) communication systems, efforts have been made to develop an improved fifth generation (5G) or pre-5G communication system. Therefore, the 5G or pre-5G communication system is also called a 'Beyond 4G Network' or a 'Post long term evolution (LTE) System'. The 5G communication system is considered to be implemented in higher frequency (mmWave) bands, e.g., 60 GHz bands, so as to accomplish higher data rates. To decrease propagation loss of the radio waves and increase the transmission distance, the beamforming, massive multiple-input multiple-output (MIMO), full dimensional MIMO (FD-MIMO), array antenna, an analog beam forming, large scale antenna techniques are discussed in 5G communication systems. In addition, in 5G communication systems, development for system network improvement is under way based on advanced small cells, cloud radio access networks (RANs), ultra-dense networks, device-to-device (D2D) communication, wireless backhaul, moving network, cooperative communication, coordinated multi-points (CoMP), reception-end interference cancellation and the like. In the 5G system, Hybrid FSK and QAM Modulation (FQAM) and sliding window superposition coding (SWSC) as an advanced coding modulation (ACM), and filter bank multi carrier (FBMC), non-orthogonal multiple access (NOMA), and sparse code multiple access (SCMA) as an advanced access technology have been developed.

The Internet, which is a human centered connectivity network where humans generate and consume information, is now evolving to the internet of things (IoT) where distributed entities, such as things, exchange and process information without human intervention. The internet of everything (IoE), which is a combination of the IoT technology and the Big Data processing technology through connection with a cloud server, has emerged. As technology elements, such as "sensing technology", "wired/wireless communication and network infrastructure", "service interface technology", and "Security technology" have been demanded for IoT implementation, a sensor network, a machine-to-machine (M2M) communication, machine type communication (MTC), and so forth have been recently researched. Such an IoT environment may provide intelligent Internet technology services that create a new value to human life by collecting and analyzing data generated among connected things. IoT may be applied to a variety of fields including smart home, smart building, smart city, smart car or connected cars, smart grid, health care, smart appliances and advanced medical services through convergence and combination between existing information technology (IT) and various industrial applications.

In line with this, various attempts have been made to apply 5G communication systems to IoT networks. For example, technologies such as a sensor network, MTC, and M2M communication may be implemented by beamforming, MIMO, and array antennas. Application of a cloud RAN as the above-described Big Data processing technology may also be considered to be as an example of convergence between the 5G technology and the IoT technology.

In the 5G communication system, the channel bandwidth is expected to increase up to 1 GHz so as to enable transmission of large amounts of data; therefore, it is necessary to implement a power amplifier of high power and high linearity in order to realize a communication system of mmWave band. However, it is difficult for a power amplifier structure to maintain the linearity in a wide band such as 1 GHz according to the related art. Thus, the efficiency of the power amplifier is also decreased.

The above information is presented as background information only to assist with an understanding of the present disclosure. No determination has been made, and no assertion is made, as to whether any of the above might be applicable as prior art with regard to the present disclosure.

SUMMARY

Aspects of the present disclosure are to address at least the above-mentioned problems and/or disadvantages and to provide at least the advantages described below. Accordingly, an aspect of the present disclosure is to provide a power amplification device capable of maintaining high power and high linearity even in a wide band by minimizing the envelope impedance that affects the linearity of a power amplifier.

In accordance with an aspect of the present disclosure, a power amplification device is provided. The power amplification device includes a power amplifier configured to amplify an input signal, and an element connected to the power amplifier and configured to reduce envelope impedance, thereby maintaining linearity of the power amplifier.

The element may be further configured to have output impedance lower than a predetermined threshold value.

The element may be a regulator configured to supply power to the power amplifier.

The power amplification device may further comprise a capacitor connected to an output end of the regulator and configured to stabilize an output voltage of the regulator.

The power amplifier may be formed of one or more stages, and the element may be disposed as many as the number of the stages.

The element may be connected to a drain of a transistor included in each stage.

The envelope impedance of the power amplification device may be reduced by power supplied to each stage of the power amplifier through the element.

Isolation between the stages may be maintained by power supplied to each stage of the power amplifier through the element.

In accordance with another aspect of the present disclosure, a power amplification device is provided. The power amplification device includes one or more power amplification device units, each of which may include a power amplifier configured to amplify an input signal, and an element connected to the power amplifier and configured to reduce envelope impedance, thereby maintaining linearity of the power amplifier.

The power amplification device units may be connected in parallel with each other.

The power amplification device may further comprise one or more capacitors each of which is disposed at an input end of the element included in the power amplification device unit, and the number of capacitors may be smaller than the number of power amplification device units.

In accordance with another aspect of the present disclosure, a terminal is provided. The terminal includes a power amplification device, which may include a power amplifier configured to amplify an input signal, and an element connected to the power amplifier and configured to reduce envelope impedance, thereby maintaining linearity of the power amplifier.

In accordance with another aspect of the present disclosure, a base station is provided. The base station includes a power amplification device, which may include a power amplifier configured to amplify an input signal, and an element connected to the power amplifier and configured to reduce envelope impedance, thereby maintaining linearity of the power amplifier.

According to the present disclosure, it is possible to minimize the envelope impedance generated in a power amplification device and also maintain the isolation between respective power amplifiers constituting the power amplification device. It is therefore possible to maintain the linearity of the power amplification device.

In other words, securing the high linearity may make it possible to utilize the power amplification device even in a wideband communication network such as the fifth generation (5G) communication system.

In addition, according to the present disclosure, the linearity of the power amplification device can be maintained without adding a capacitor to each power amplifier. This is also advantageous to a reduction in size of the power amplification device.

Other aspects, advantages, and salient features of the disclosure will become apparent to those skilled in the art from the following detailed description, which, taken in conjunction with the annexed drawings, discloses various embodiments of the present disclosure.

BRIEF DESCRIPTION OF THE DRAWINGS

The above and other aspects, features, and advantages of certain embodiments of the present disclosure will be more apparent from the following description taken in conjunction with the accompanying drawings, in which.

Throughout the drawings, it should be noted that like reference numbers are used to depict the same or similar elements, features, and structures.

DETAILED DESCRIPTION

Figure 1:
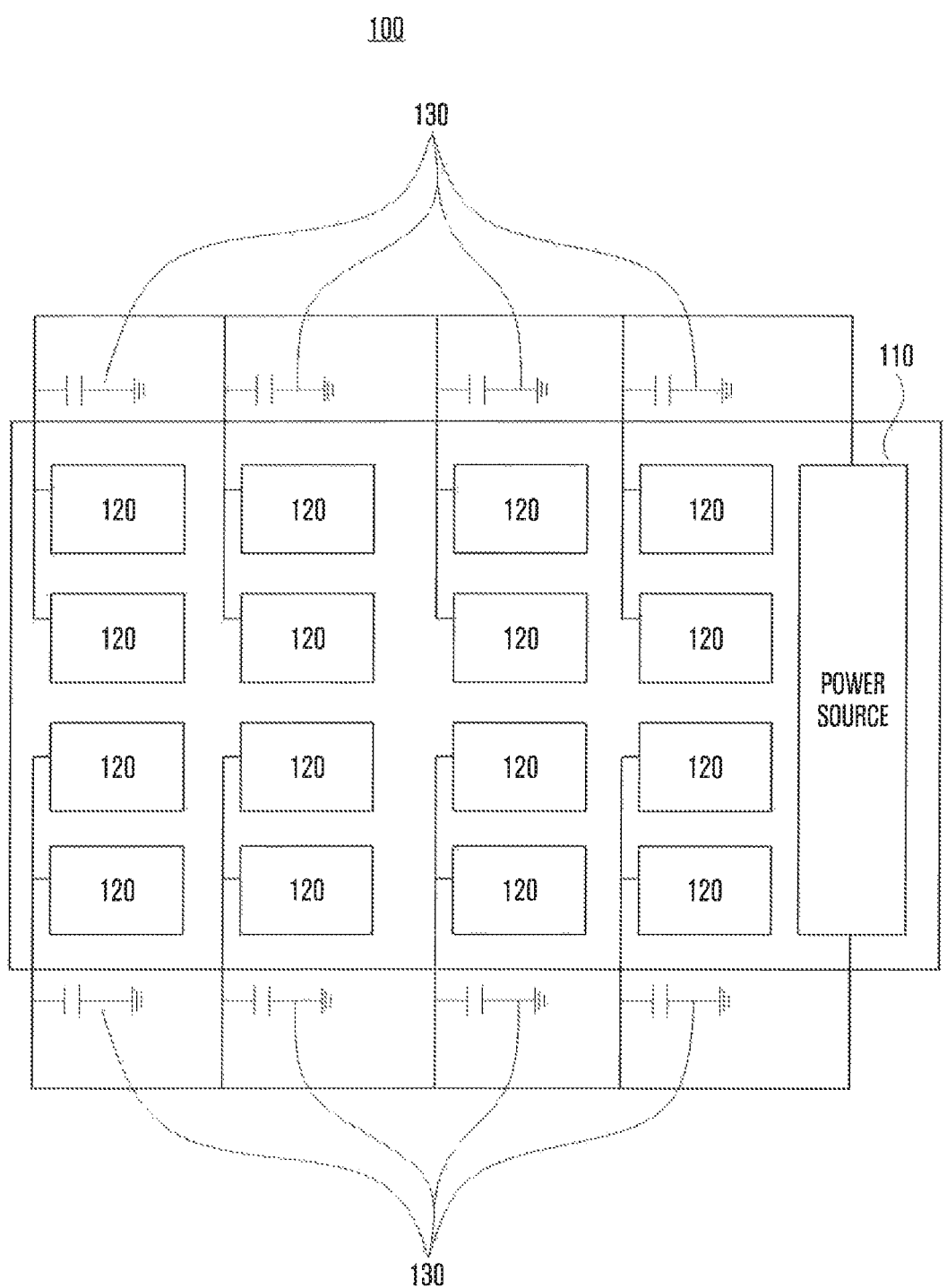
FIG. 1 is a diagram illustrating a typical power amplification device including a plurality of power amplification device units according to an embodiment of the present disclosure.

The following description with reference to the accompanying drawings is provided to assist in a comprehensive understanding of various embodiments of the present disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the present disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the present disclosure. Accordingly, it should be apparent to those skilled in the art that the following description of various embodiments of the present disclosure is provided for illustration purpose only and not for the purpose of limiting the present disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

In this disclosure, terms are defined in consideration of functions of this disclosure and may be varied depending on a user or an operator's intention or custom. Therefore, the definition should be made based on the contents throughout this description. For the same reason, some elements are exaggerated, omitted or schematically shown in the accompanying drawings. Also, the size of each element does not entirely reflect the actual size. In the drawings, the same or corresponding elements are denoted by the same reference numerals.

The advantages and features of the present disclosure and the manner of achieving them will become apparent with reference to the embodiments described in detail below with reference to the accompanying drawings. The present disclosure may, however, be embodied in many different forms and should not be construed as limited to the embodiments set forth herein. Rather, these embodiments are provided so that this disclosure will be thorough and complete and will fully convey the scope of the disclosure to those skilled in the art, and the disclosure is only defined by the scope of the claims.

It will be understood that each block of the flowchart illustrations, and combinations of blocks in the flowchart illustrations, may be implemented by computer program instructions. These computer program instructions may be provided to a processor of a general purpose computer, special purpose computer, or other programmable data processing apparatus to produce a machine, such that the instructions, which are executed via the processor of the computer or other programmable data processing apparatus, generate means for implementing the functions specified in the flowchart block or blocks. These computer program instructions may also be stored in a computer usable or computer-readable memory that may direct a computer or other programmable data processing apparatus to function in a particular manner, such that the instructions stored in the computer usable or computer-readable memory produce an article of manufacture including instruction means that implement the function specified in the flowchart block or blocks. The computer program instructions may also be loaded onto a computer or other programmable data processing apparatus to cause a series of operations to be performed on the computer or other programmable apparatus to produce a computer implemented process such that the instructions that are executed on the computer or other programmable apparatus provide operations for implementing the functions specified in the flowchart block or blocks.

Also, each block of the flowchart illustrations may represent a module, segment, or portion of code, which comprises one or more executable instructions for implementing the specified logical function(s). It should also be noted that in some alternative implementations, the functions noted in the blocks may occur out of the order. For example, two blocks shown in succession may in fact be executed substantially concurrently or the blocks may sometimes be executed in the reverse order, depending upon the functionality involved.

The term "unit", as used herein, may refer to a software or hardware component or device, such as a field programmable gate array (FPGA) or application specific integrated circuit (ASIC), which performs certain tasks. A unit may be configured to reside on an addressable storage medium and configured to execute on one or more processors. Thus, a module or unit may include, by way of example, components, such as software components, object-oriented software components, class components and task components, processes, functions, attributes, procedures, subroutines, segments of program code, drivers, firmware, microcode, circuitry, data, databases, data structures, tables, arrays, and variables. The functionality provided for in the components and modules/units may be combined into fewer components and modules/units or further separated into additional components and modules.

FIG. 1 is a diagram illustrating a typical power amplification device including a plurality of power amplification device units according to an embodiment of the present disclosure.

Referring to FIG. 1, the power amplification device 100 may include at least one power amplification device unit 120, especially, N power amplification device units 120 (N is a positive integer).

FIG. 1 shows a case where N is 16. Namely, in FIG. 1, the power amplification device 100 includes sixteen power amplification device units 120, for example.

Each of the power amplification device units 120 may receive direct current (DC) power from a power source 110. In FIG. 1, the power source 110 refers to any device capable of supplying DC power to each of the power amplification device units 120.

Therefore, the power source 110 may include a power conversion device such as a DC/DC converter as well as a DC power source such as a battery.

Each of the power amplification device units 120 amplifies and outputs an input signal through a manner of minimizing the distortion of input signal power. The power amplification device 100 including the N power amplification device units 120 may output up to N times the output power of each power amplification device unit 120 by controlling the on/off of each power amplification device unit 120.

However, the above calculation is merely a theoretical calculation, and the power amplification device does not actually operate as the above calculation because of losses from a transistor or parasitic components of a power supply line in the power amplification device.

Normally, three factors affect the operation of the power amplification device. One factor is the third-order transconductance of a transistor included in the power amplification device, another factor is the second-order harmonic impedance, and the other factor is the envelope impedance.

The influence of the third-order transconductance of a transistor may be minimized by adjusting the bias of the transistor. The influence of the second-order harmonic impedance may be minimized by integrating the second short circuit with the power amplification device.

Finally, in order to overcome the influence of the envelope impedance, a scheme of adding capacitors 130 to each of the power amplification device units 120, as shown in FIG. 1, may be considered.

However, if so, the size of the power amplification device 100 is increased because of the capacitors 130. Ultimately, the influence of the envelope impedance may not be overcome in a wideband network such as the fifth generation (5G) communication system.

Meanwhile, the envelope impedance refers to a ratio of envelope voltage to envelope current at a specific frequency, and it is a key parameter for controlling a signal in a wireless communication system.

As the value of the envelope impedance increases, the linearity of the power amplification device 100 is broken. As a result, the efficiency of the power amplification device 100 drops sharply. A detailed description thereof will be given below with reference to FIG. 2.

Figure 2:
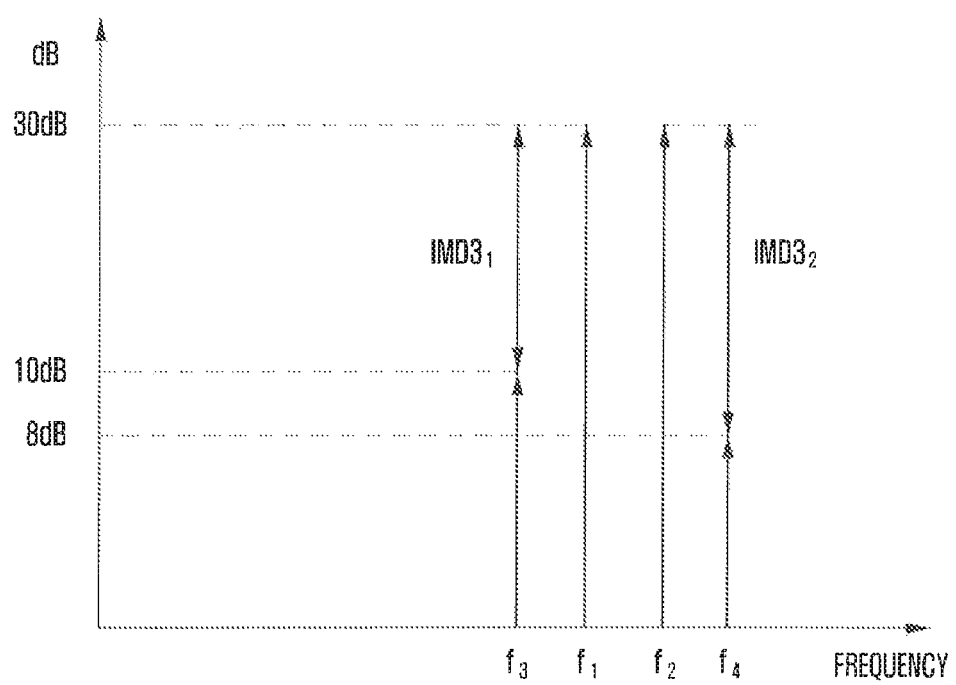
FIG. 2 is a graph illustrating a nonlinear phenomenon of a typical power amplification device according to envelope impedance according to an embodiment of the present disclosure.

FIG. 2 is a graph illustrating a nonlinear phenomenon of a typical power amplification device according to envelope impedance according to an embodiment of the present disclosure.

Referring to FIG. 2, a result of performing a tone-spacing simulation at frequencies f1 and f2 in the typical power amplification device as shown in FIG. 1. In this case, intermodulation distortion (IMD) such as f3 and f4 may occur due to the envelope impedance.

The IMD is caused by output frequency components that are combinations of the sum of and difference between harmonic frequencies of two different frequency signals. The IMD is a distortion factor, like noise, that interferes with the original signals f1 and f2.

The IMD refers to the magnitude of the distorted signals f3 and f4. However, the absolute magnitude of the distorted signals f3 and f4 is meaningless, and it is important how small the distorted signals f3 and f4 are in comparison with the original signals f1 and f2.

Therefore, in general, the IMD indicates a difference (dBc) between the original signal and the distorted signal. Namely, in case of FIG. 2, the first third-order IMD (IMD31) is −20 dB (i.e., −|30−10| dB), and the second third-order IMD (IMD32) is −22 dB (i.e., −|30−8| dB).

In case of FIG. 2, the linearity of the power amplification device may be broken because the value of the first third-order IMD (−20 dB) and the value of the second third-order IMD (−22 dB) are not smaller than a reference value for maintaining the linearity.

Although the reference value for maintaining the linearity of the power amplification device may be varied depending on the specifications of the power amplification device, values of −35 dB or less may be generally regarded as being sufficient to maintain the linearity of the power amplification device.

Figure 3:
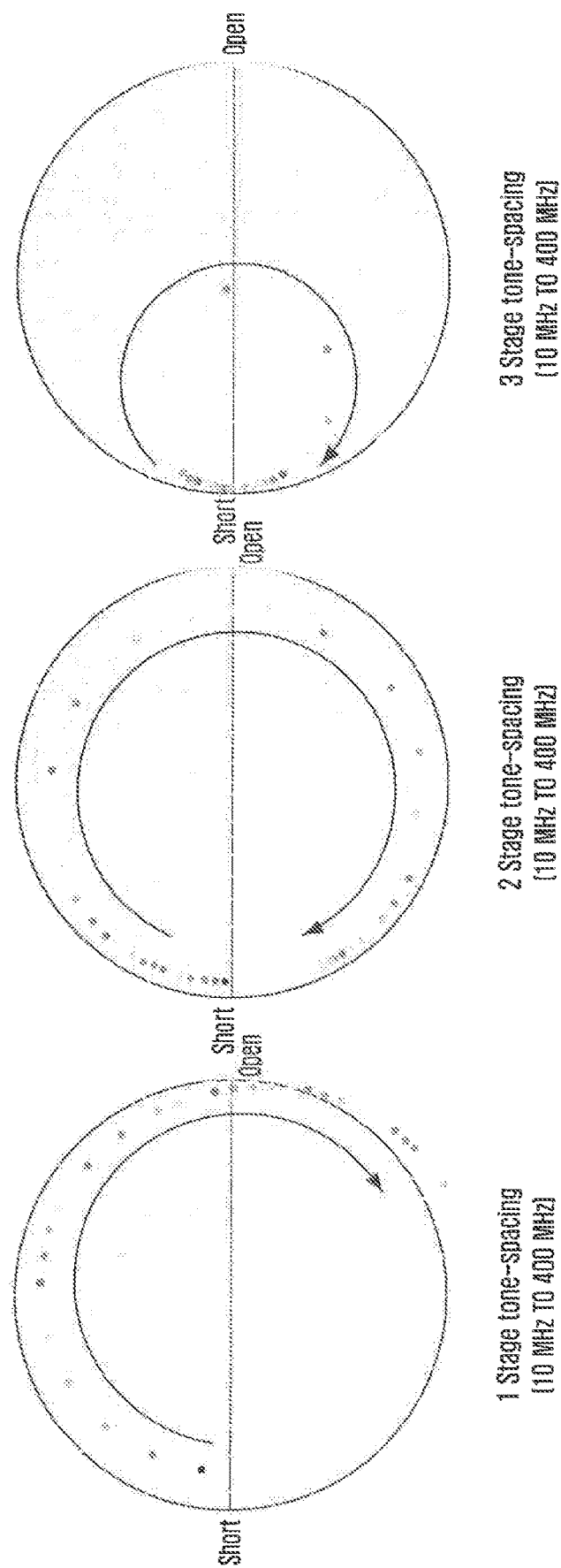
FIG. 3 is a diagram illustrating a Smith chart of a typical power amplification device unit according to an embodiment of the present disclosure.

FIG. 3 is a diagram illustrating a Smith chart of a typical power amplification device unit according to an embodiment of the present disclosure.

The Smith chart shown in FIG. 3 is obtained by measuring an envelope impedance value at each stage when the tone-spacing simulation is performed from 10 MHz to 400 MHz, assuming that the power amplification device unit is composed of three stages.

The Smith chart is a circular diagram that visualizes the complex impedance. The impedance value decreases as it gets closer to the left of the circle (closer to short), whereas the impedance value increases as it gets closer to the right of the circle (closer to open).

In the Smith chart of the first stage, the impedance value is relatively small at the initial 10 MHz. However, as the frequency increases, the impedance values rotate clockwise along the periphery of the Smith chart and approach infinity in some frequency ranges.

In other words, it can be predicted through the Smith chart that the first stage of the power amplification device unit will be greatly affected by the envelope impedance in most frequency ranges; thus, the linearity of the power amplification device will be broken.

Even in the second and third stages, as in the first stage, when the frequency increases, the impedance values rotate clockwise along the periphery of the Smith chart and become greater in some frequency ranges.

However, the impedance in the third stage is not as great as the impedance in the first and second stages. Nevertheless, the impedance value is about 50 ohm in some frequency components; thus, the linearity of the power amplification device may be broken.

As discussed with reference to FIGS. 2 and 3, the typical power amplification device may not avoid the linearity deterioration phenomenon caused by the envelope impedance. Accordingly, a solution is needed to overcome this.

Figure 4:
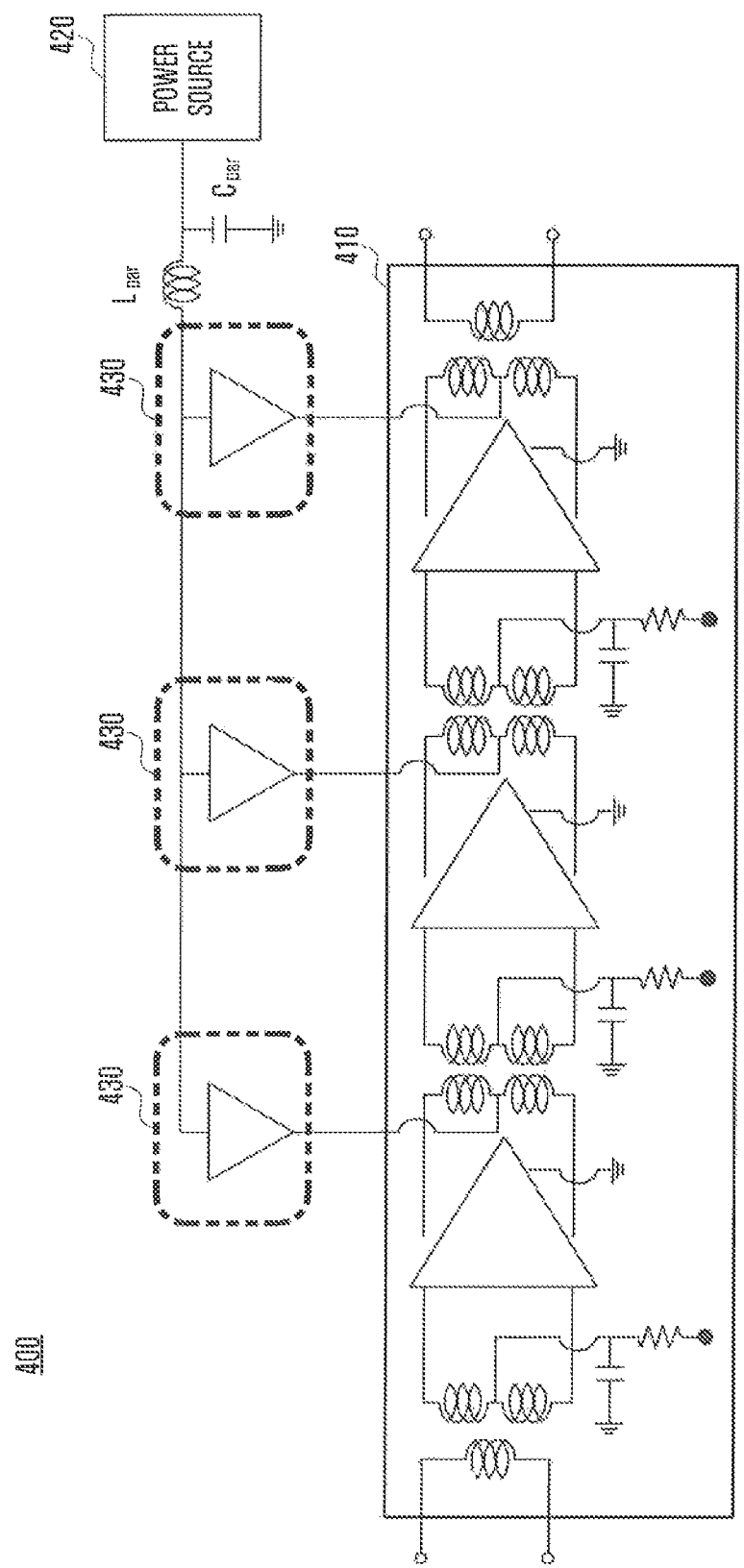
FIG. 4 is a diagram illustrating a power amplification device unit according to an embodiment of the present disclosure.

FIG. 4 is a diagram illustrating a power amplification device unit according to an embodiment the present disclosure.

Referring to FIG. 4, the power amplification device unit 400 according to the present disclosure may include a power amplifier 410 for amplifying an input signal, and an element 430 connected to the power amplifier 410 to reduce the envelope impedance so that the linearity of the power amplifier 410 can be maintained.

The power amplifier 410 may be composed of at least one stage, and the element 430 may be arranged by the number of such stages.

FIG. 4 shows the power amplifier 410 having three stages as an embodiment of the present disclosure. Therefore, the scope of the present disclosure should not be limited to the power amplifier 410 shown in FIG. 4. Further, detailed components (e.g., transistors, resistors, etc.) constituting the power amplifier 410 should not be limited to an embodiment of FIG. 4.

In addition, each stage constituting the power amplification device unit 400 may be configured to have the same gain value or to have different gain values. It is therefore possible to obtain a desired gain value through the power amplification device unit 400.

For example, if the gain value of the first stage is 5 dB, if the gain value of the second stage is 4 dB, and if the gain value of the third stage is 7 dB, the gain value of the power amplification device unit 400 including the three stages is 16 dB (i.e., the sum of 5 dB, 4 dB, and 7 dB).

The element 430 according to the present disclosure is connected to a power source 420 and supplies power to each stage. Therefore, as described above, the number of the elements 430 is equal to the number of the stages. Specifically, the element 430 disposed for each stage is connected to a drain of a transistor included in each stage, thereby supplying power to each stage.

Accordingly, as the power is supplied to each stage by the element 430, the influence of parasitic components (Lpar, Cpar) of a power supply line on the power supplied to each stage may be minimized.

Even if noise is applied to the power source 420, the element 430 is capable of always supplying stable power to each stage of the power amplifier 410. Thus, if the output impedance of the element 430 is set to be lower than a predetermined threshold value, the linearity of the power amplification device unit 400 may be maintained.

As the output impedance of the element 430 becomes smaller, the impedance value at each stage directed to the power source may also become smaller. Namely, the envelope impedance caused by the parasitic components (Lpar, Cpar) of the power supply line may be reduced.

In other words, as the output impedance of the element 430 becomes smaller, the power amplification device unit 400 may maintain high linearity.

Ideally, it is most preferable that the output impedance of the element 430 is zero. However, it is difficult to make the output impedance zero because of difficulty in actual implementation of a circuit.

Therefore, it is preferable to set the maximum output impedance value capable of maintaining the linearity of the power amplification device unit 400 to the threshold value. The threshold value may be varied depending on the form of the power amplifier 410 or the power amplification device unit 400.

If the power is supplied to each stage of the power amplifier 410 through the element 430, the effect of maintaining isolation between stages may be obtained in addition to the effect of reducing the envelope impedance of the power amplification device unit 400.

In this disclosure, the term "isolation" refers to a state in which the stages are not influenced by each other. If each stage maintains an isolation state, the gain value of the power amplifier 410 may be determined by summing the gain values of the respective stages.

In addition, the isolation may remove noise that can be induced in each stage because of a difference in ground level among the respective stages.

Therefore, according to the present disclosure, the supply of power through the element 430 may allow the stages constituting the power amplifier 410 to maintain isolation, thereby supporting stable operation of the power amplifier 410.

Meanwhile, the element 430 according to the present disclosure may be formed of a regulator in view of providing a stable voltage to the power amplifier 410, and it may include a low dropout (LDO) regulator.

The LDO regulator is an efficient regulator when an output voltage is lower than an input voltage and when a voltage difference between the input and output voltages is small, and it may also remove noise of input power.

In addition, the LDO regulator may perform a function of stabilizing a circuit including the LDO regulator by locating a dominant pole in the circuit because of having low output impedance. Therefore, the envelope impedance of the power amplification device unit 400 may be reduced through the LDO regulator.

In addition, a capacitor may be connected to an output end of the regulator to stabilize the output voltage of the regulator and further reduce the output impedance of the regulator. This may further reduce the envelope impedance of the power amplification device unit 400.

Figure 5:
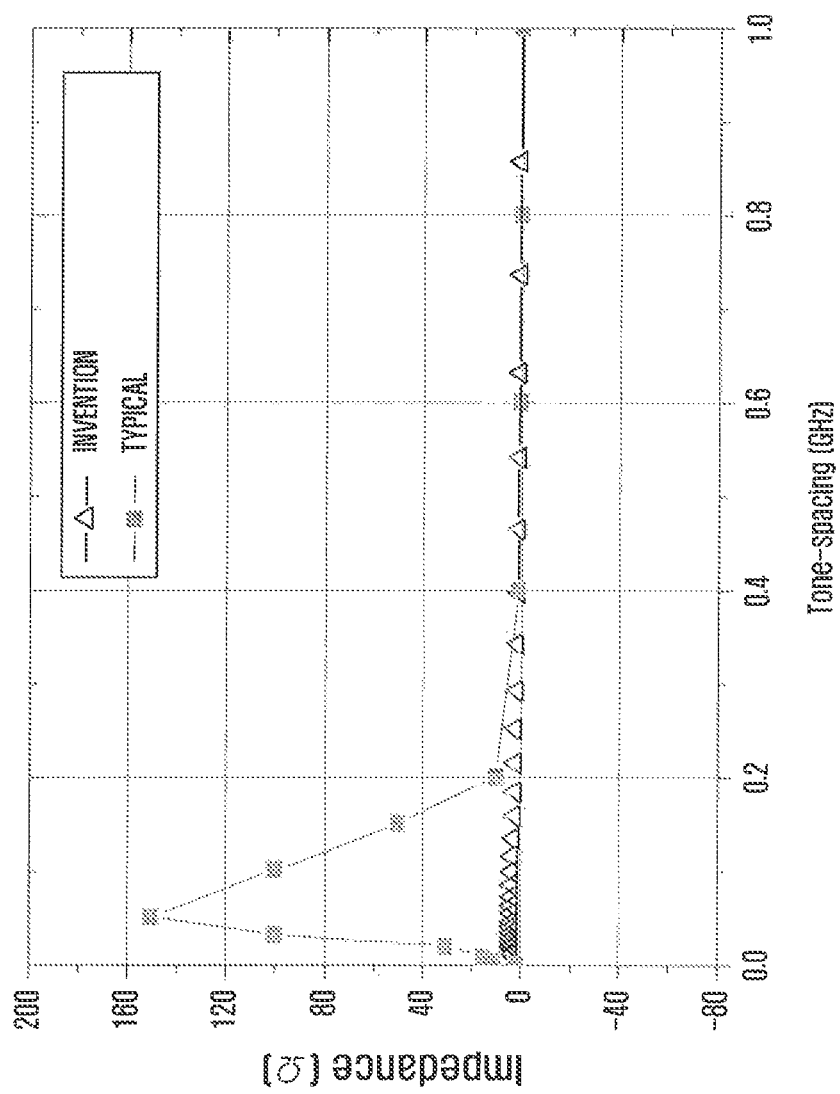
FIG. 5 is a graph illustrating the envelope impedance of a power amplification device unit according to an embodiment the present disclosure.

FIG. 5 is a graph illustrating the envelope impedance of a power amplification device unit according to an embodiment the present disclosure.

Referring to FIG. 5, shows envelope impedance values according to frequency as results of tone-spacing simulation in case of the present disclosure (i.e., in case of the power amplification device unit including the above-discussed element) and in case of a typical technique.

With a typical technique, the envelope impedance has a great value when the tone spacing, i.e., a frequency difference (bandwidth), is 200 MHz or less. Especially, when the frequency difference is near 100 MHz, the envelope impedance has a considerably great value of about 150 ohm.

On the contrary, with the present disclosure, the envelope impedance always has a constant value regardless of the frequency difference. In addition, the magnitude of the envelope impedance is almost zero.

Therefore, it can be seen that the power amplification device unit according to the present disclosure has lower envelope impedance in the entire frequency range than that of the typical power amplification device unit. In other words, the power amplification device unit according to the present disclosure has better linearity than that of the typical power amplification device unit.

Figure 6:
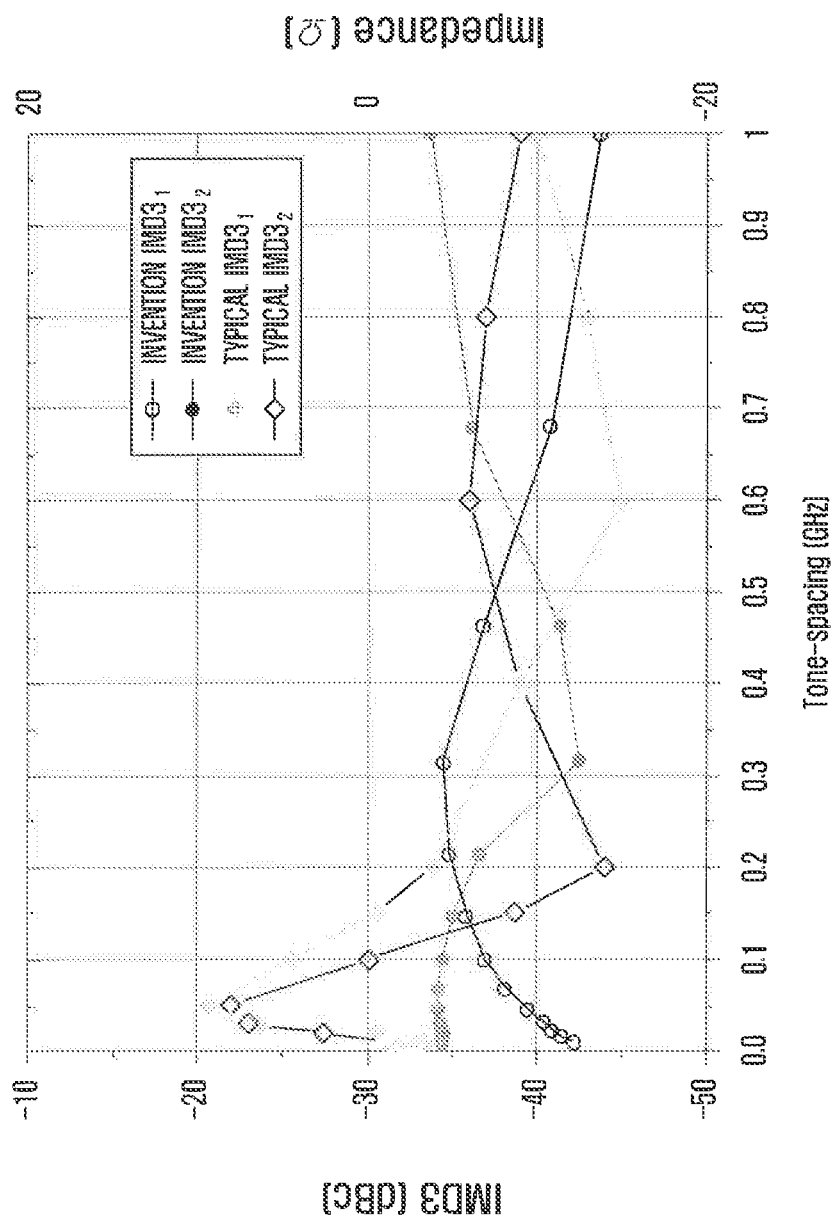
FIG. 6 is a graph illustrating the third-order intermodulation characteristics of a power amplification device unit according to an embodiment the present disclosure.

FIG. 6 is a graph illustrating the third-order intermodulation characteristics of a power amplification device unit according to an embodiment the present disclosure.

Referring to FIG. 6, shows the third-order intermodulation distortion (IMD3) as discussed above in FIG. 2 when the same tone-spacing simulation as in FIG. 5 is performed in case of the present disclosure and in case of a typical technique.

With a typical technique, IMD31 and IMD32 have values of about −20 dB in the vicinity of 100 MHz. As discussed above with reference to FIG. 2, when the IMD3 value is −35 dB or more, the linearity of the power amplification device unit may be broken.

Therefore, with the typical technique as shown in FIG. 6, it can be predicted that the linearity of the power amplification device unit will be broken when a frequency difference is about 100 MHz. This is consistent with the above description regarding FIG. 5 that the envelope impedance has a maximum value near a frequency difference of 100 MHz in case of the typical technique.

On the contrary, according to the present disclosure, the IMD3 has a value of about −35 dB or less regardless of the value of a frequency difference. Therefore, it can be seen that the power amplification device unit according to the present disclosure may maintain linearity in the entire frequency range.

Figure 7:
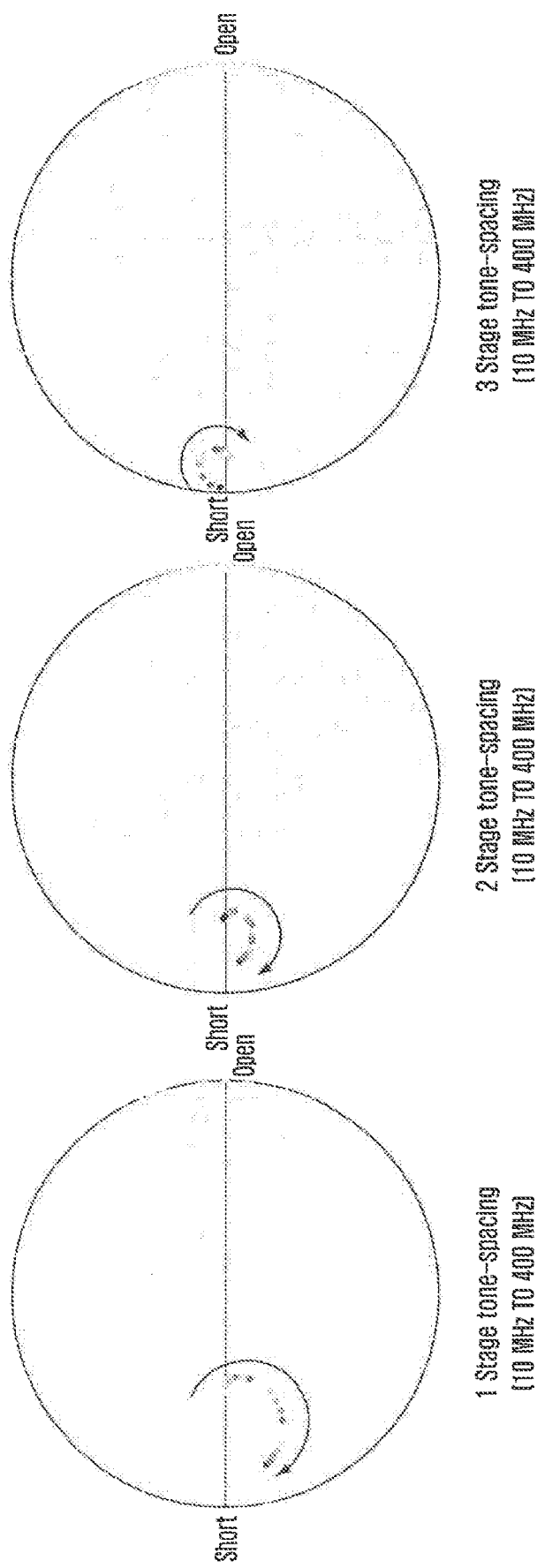
FIG. 7 is a diagram illustrating a Smith chart of a power amplification device unit according to an embodiment the present disclosure.

FIG. 7 is a diagram illustrating a Smith chart of a power amplification device unit according to an embodiment the present disclosure.

Referring to FIG. 7, shows a Smith chart on the assumption that the power amplifier of the power amplification device unit is composed of three stages. From the Smith charts shown in FIGS. 7 and 3, the envelope impedance of each stage can be compared between the present disclosure and the typical technique.

As shown in FIG. 7, the impedance exists in the left semicircle at all stages of the power amplifier. Namely, the impedance values of all the stages become 50 ohm or less in the entire frequency range for the simulation (i.e., from 10 MHz to 400 MHz).

Therefore, contrary to the typical technique as shown in FIG. 3, it can be predicted that linearity will be maintained at all the stages constituting the power amplification device unit with the present disclosure.

Figure 8:
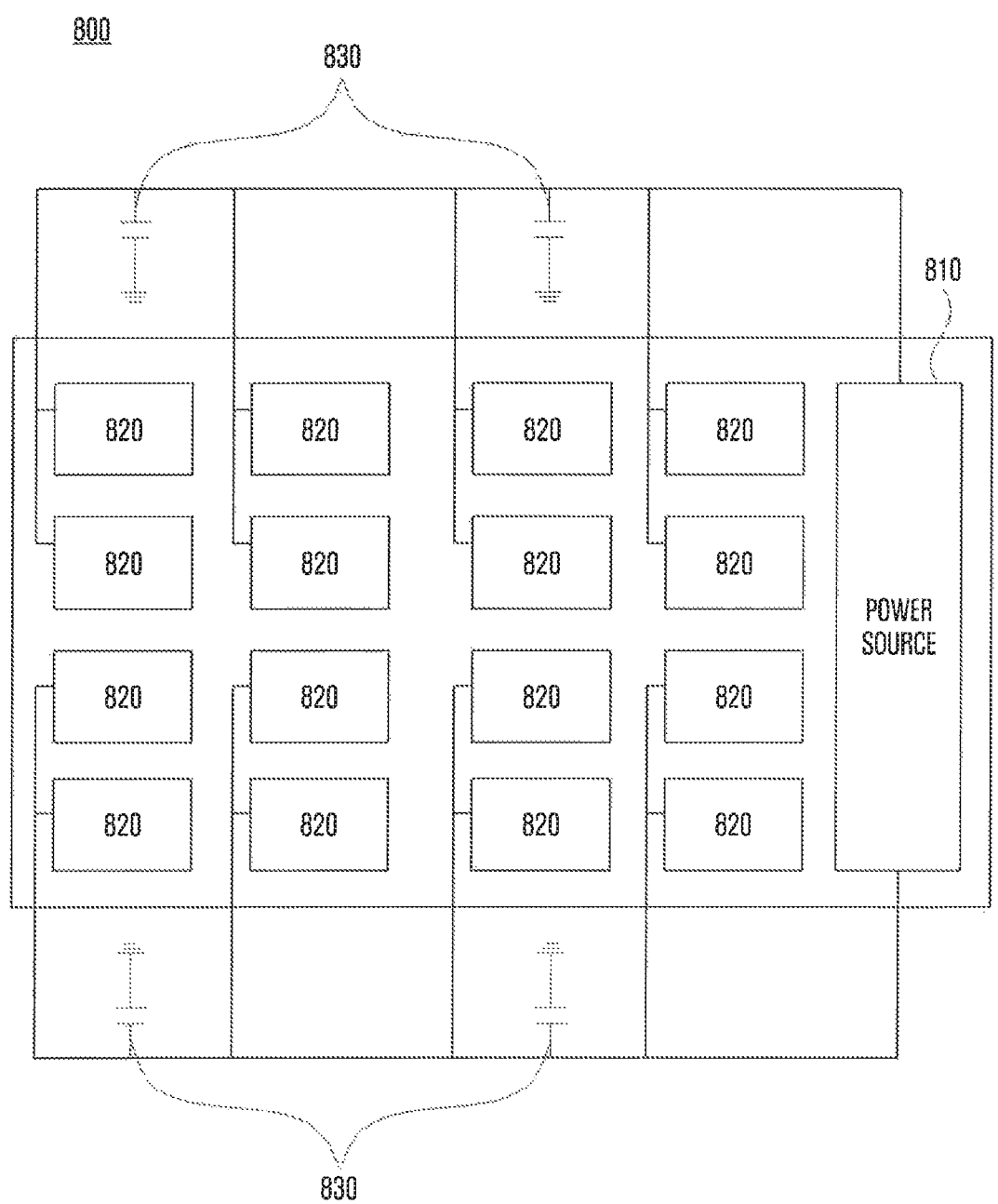
FIG. 8 is a diagram illustrating a power amplification device including a plurality of power amplification device units according to an embodiment the present disclosure.

Meanwhile, in addition to a method of constructing one power amplification device with only one power amplification device unit, a method of constructing one power amplification device with a plurality of power amplification device units may be considered to increase a power amplification rate. FIG. 8 is a diagram illustrating a power amplification device 800 including a plurality of power amplification device units 820.

According to the present disclosure, each of the power amplification devices 800 may include a power amplifier for amplifying an input signal, and an element connected to the power amplifier to reduce the envelope impedance and thereby maintain the linearity of the power amplifier.

FIG. 8 shows the power amplification device 800 formed of N power amplification device units 820, like the power amplification device shown in FIG. 1. The respective power amplification device units 820 are connected in parallel with each other, thereby constituting the power amplification device 800.

In this case, similar to the isolation of each stage in the power amplifier discussed above with reference to FIG. 4, the isolation between the power amplification device units 820 may be maintained by the elements provided for the respective power amplification device units 820.

In other words, the gain value of the power amplification device 800 may be determined by summing the gain values of the respective power amplification device units 820, and also noise that can be induced in each of the power amplification device units 820 because of a difference in ground level among the respective power amplification device units 820 may be removed.

In addition, the power amplification device 800 according to the present disclosure may include capacitors 830, each of which is disposed at an input end of the element included in the power amplification device unit 820.

The capacitors 830 are disposed based on a power supply line for supplying power from a power source 810 to each power amplification device unit 820, rather than disposed for each power amplification device unit 820. Therefore, the number of capacitors 830 disposed in the power amplification device 800 may be smaller than the number of the power amplification device units 820.

Referring to FIG. 8 shows the capacitors 830, each of which is allocated to four power amplification device units 820. In this case, the number of capacitors 830 is reduced by half in comparison with the typical power amplification device shown in FIG. 1.

Therefore, in addition to having the effect of reducing the envelope impedance in comparison with the typical power amplification device, the power amplification device 800 according to the present disclosure may have the effect of reducing the number of capacitors and further reducing the size of the device.

Figure 9:
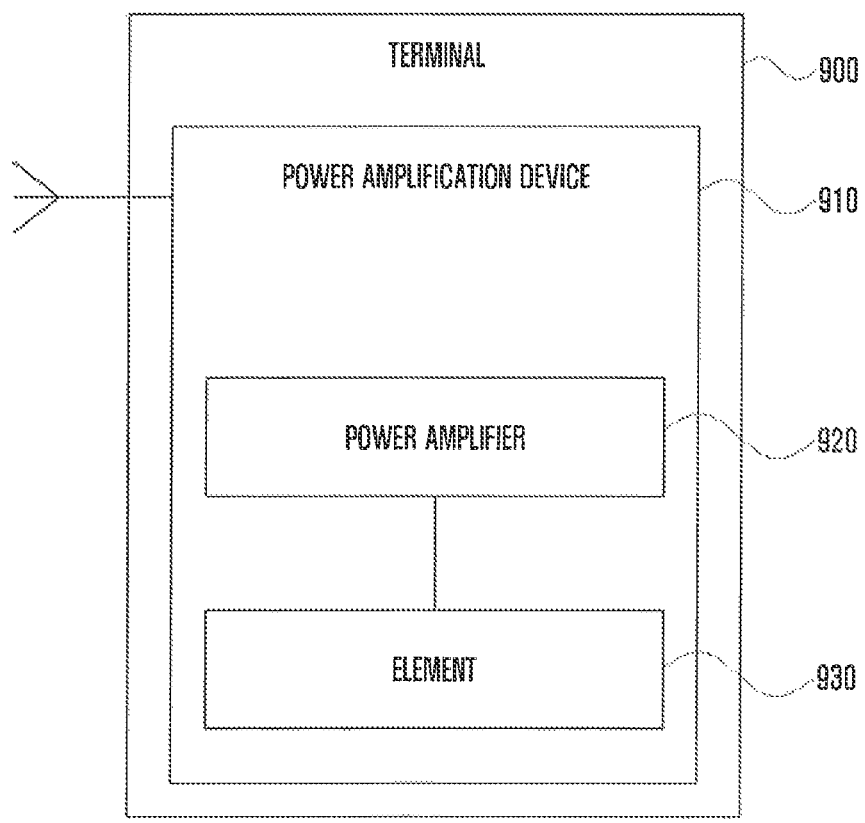
FIG. 9 is a block diagram illustrating a configuration of a terminal including a power amplification device according to an embodiment the present disclosure.

FIG. 9 is a block diagram illustrating a configuration of a terminal including a power amplification device according to an embodiment the present disclosure.

Referring to FIG. 9, the terminal 900 may include the power amplification device 910 connected to a wireless antenna. The power amplification device 910 may include a power amplifier 920 for amplifying an input signal and an element 930 connected to the power amplifier 920 to reduce the envelope impedance and thereby maintain the linearity of the power amplifier 920.

Figure 10:
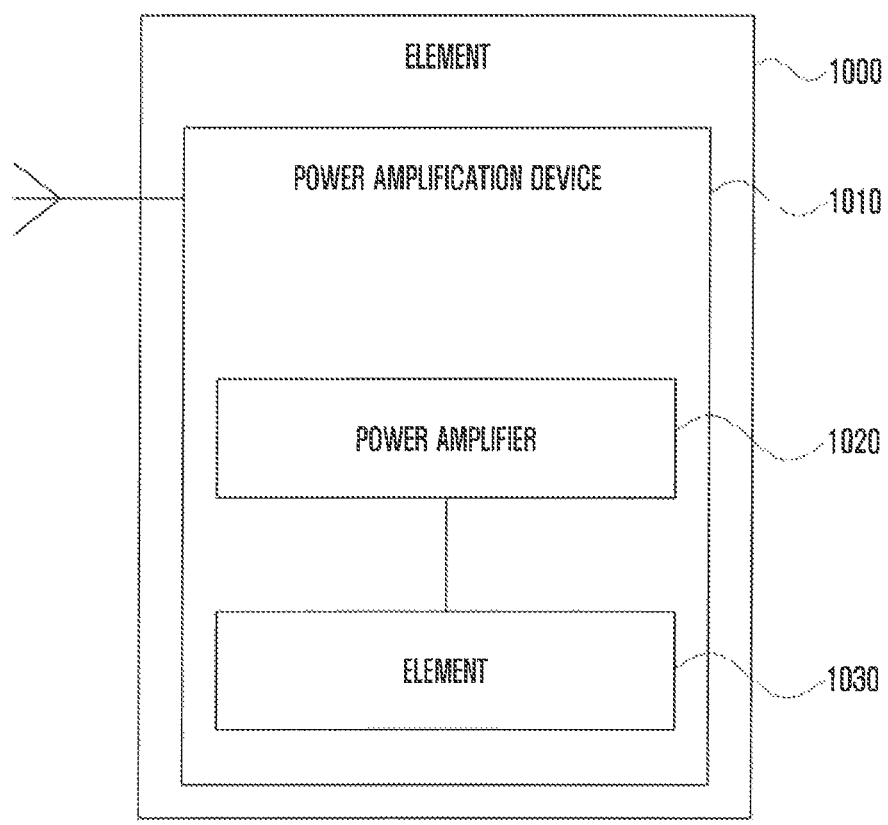
FIG. 10 is a block diagram illustrating a configuration of a base station including a power amplification device according to an embodiment the present disclosure.

FIG. 10 is a block diagram illustrating a configuration of a base station including a power amplification device according to an embodiment the present disclosure.

Referring to FIG. 10, the base station 1000 may include the power amplification device 1010 connected to a wireless antenna. The power amplification device 1010 may include a power amplifier 1020 for amplifying an input signal, and an element 1030 connected to the power amplifier 1020 to reduce the envelope impedance and thereby maintain the linearity of the power amplifier 1020.

While the present disclosure has been particularly shown and described with reference to embodiments thereof, it is clearly understood that the same is by way of illustration and example only and is not to be taken in conjunction with the present disclosure. It will be understood by those skilled in the art that various changes in form and details may be made therein without departing from the subject matter and scope of the present disclosure. Also, the above discussed embodiments can be combined with each other as needed. Although the above embodiments are proposed on the basis of the 5G system, any modification based on the technical idea of the above embodiments can be implemented in any other system.

While the present disclosure has been shown and described with reference to various embodiments thereof, it will be understood by those skilled in the art that various changes in form and details may be made therein without departing from the spirit and scope of the present disclosure as defined by the appended claims and their equivalents.

What is claimed is:

1. A power amplification device comprising:
    a power amplification device unit,
    wherein the power amplification device unit comprises:
        a power amplifier configured to amplify an input signal; and
        a plurality of regulators connected to the power amplifier,
    wherein the power amplifier comprises a plurality of stages,
    wherein each of the plurality of regulators is connected to each of the plurality of stages respectively,
    wherein each of the plurality of regulators is configured to supply power to a connected stage from the plurality of stages, and
    wherein each of the plurality of regulators is configured to have an output impedance lower than a predetermined threshold value.

2. The power amplification device of claim 1, further comprising:
    at least one capacitor connected to an output end of each of the plurality of regulators.

3. The power amplification device of claim 1, wherein each of the plurality of regulators is connected to a drain of a transistor included in each of the plurality of stages.

4. The power amplification device of claim 1,
    wherein an envelope impedance of the power amplification device is reduced by supplying power to each of the plurality of stages through each of the plurality of regulators, and
    wherein the envelope impedance indicates a ratio of envelope voltage to envelope current at a specific frequency of the power amplification device unit.

5. The power amplification device of claim 1, wherein isolation indicating a state in which the plurality of stages are not influenced by each other is maintained by supplying power to each of the plurality of stages through each of plurality of regulators.

6. The power amplification device of claim 5, wherein a gain value of the power amplifier is determined by summing gain values of each of the plurality of stages.

7. A power amplification device comprising:
    a plurality of power amplification device units,
    wherein each of the plurality of power amplification device units comprises:
        a power amplifier configured to amplify an input signal; and
        a plurality of regulators connected to the power amplifier,
    wherein the power amplifier comprises a plurality of stages,
    wherein each of the plurality of regulators is connected to each of the plurality of stages respectively,
    wherein each of the plurality of regulators is configured to supply power to a connected stage from the plurality of stages, and
    wherein each of the plurality of regulators is configured to have an output impedance lower than a predetermined threshold value.

8. The power amplification device of claim 7, further comprising:
    at least one capacitor connected to an output end of each of the plurality of regulators.

9. The power amplification device of claim 7, wherein each of the plurality of regulators is connected to a drain of a transistor included in each of the plurality of stages.

10. The power amplification device of claim 7, wherein the plurality of power amplification device units are connected in parallel with each other.

11. The power amplification device of claim 7,
wherein an envelope impedance of the power amplification device is reduced by supplying power to each of the plurality of stages through each of the plurality of regulators, and
wherein the envelope impedance indicates a ratio of envelope voltage to envelope current at a specific frequency of the plurality of power amplification device units.

12. The power amplification device of claim 7, wherein isolation indicating a state in which the plurality of power amplification device units are not influenced by each other is maintained by supplying power to each of the plurality of stages through each of the plurality of regulators.

13. The power amplification device of claim 12,
wherein gain values of each of the plurality of power amplifier device units are determined by summing gain values of each of the plurality of stages included in each of the power amplifiers, and
wherein a gain value of the power amplification device is determined by summing the gain values of each of the plurality of power amplification device units.

14. The power amplification device of claim 7, further comprising:
at least one capacitor is connected to an input end of the plurality of power amplification device units,
wherein a number of the at least one capacitor is smaller than a number of the plurality of power amplification device units.

15. A terminal comprising:
a power amplification device,
wherein the power amplification device comprises:
a power amplifier configured to amplify an input signal; and
a plurality of regulators connected to the power amplifier,
wherein the power amplifier comprises a plurality of stages,
wherein each of the plurality of regulators is connected to each of the plurality of stages respectively,
wherein each of the plurality of regulators is configured to supply power to a connected stage from the plurality of stages, and
wherein each of the plurality of regulators is configured to have an output impedance lower than a predetermined threshold value.

16. A base station comprising:
a power amplification device,
wherein the power amplification device comprises:
a power amplifier configured to amplify an input signal; and
a plurality of regulators connected to the power amplifier,
wherein the power amplifier comprises a plurality of stages,
wherein each of the plurality of regulators is connected to each of the plurality of stages respectively,
wherein each of the plurality of regulators is configured to supply power to a connected stage from the plurality of stages, and
wherein each of the plurality of regulators is configured to have an output impedance lower than a predetermined threshold value.

* * * * *